(12) United States Patent
Reid et al.

(10) Patent No.: US 8,160,410 B2
(45) Date of Patent: Apr. 17, 2012

(54) BRAGG REFLECTOR GRATING

(75) Inventors: Douglas Charles John Reid, Rugby (GB); Andrew John Ward, Moulton (GB)

(73) Assignee: Oclaro Technology Limited, Northamptonshire (GB)

( * ) Notice: Subject to any disclaimer, the term of this patent is extended or adjusted under 35 U.S.C. 154(b) by 664 days.

(21) Appl. No.: 12/096,307

(22) PCT Filed: Dec. 8, 2006

(86) PCT No.: PCT/GB2006/004578
§ 371 (c)(1),
(2), (4) Date: Nov. 11, 2008

(87) PCT Pub. No.: WO2007/066118
PCT Pub. Date: Jun. 14, 2007

(65) Prior Publication Data
US 2009/0161717 A1    Jun. 25, 2009

(30) Foreign Application Priority Data
Dec. 8, 2005   (GB) .................................. 0524994.1

(51) Int. Cl.
*G02B 6/34*    (2006.01)
*G02B 5/18*    (2006.01)
*H01S 3/08*    (2006.01)

(52) U.S. Cl. ............................ 385/37; 359/569; 372/102
(58) Field of Classification Search ................. 359/566, 359/569, 572, 576; 372/20, 102; 385/37
See application file for complete search history.

(56) References Cited

U.S. PATENT DOCUMENTS

| | | | |
|---|---|---|---|
| 2004/0151215 A1 | 8/2004 | Reid et al. | |
| 2004/0218638 A1* | 11/2004 | Carter et al. | ................ 372/20 |
| 2005/0053102 A1 | 3/2005 | Reid | |

FOREIGN PATENT DOCUMENTS

| | | |
|---|---|---|
| WO | WO-02/075867 A2 | 9/2002 |
| WO | WO-03/012936 A2 | 2/2003 |

OTHER PUBLICATIONS

UK Search Report for GB 0524994.1 dated May 17, 2006.

* cited by examiner

*Primary Examiner* — Alessandro Amari
(74) *Attorney, Agent, or Firm* — Patterson & Sheridan, L.L.P.

(57) ABSTRACT

A Bragg reflector grating comprises a plurality of chirped grating sections (65-72), in which at least a first chirped grating section and a second chirped grating section have differing ranges of grating pitches. The combined range of grating pitches provided by the first and second chirped grating sections includes at least one discontinuity, such that the first and second chirped grating sections have one or more grating pitches in common and/or there are one or more ranges of grating pitches within the combined range of grating pitches that are absent.

14 Claims, 4 Drawing Sheets

BRAGG REFLECTOR GRATING

RELATED APPLICATIONS

This application is a 35 U.S.C. 371 national stage filing of International Application No. PCT/GB2006/004578, filed 8 Dec. 2006, which claims priority to Great Britain Patent Application No. 0524994.1 filed on 8 Dec. 2005 in Great Britain. The contents of the aforementioned applications are hereby incorporated by reference.

FIELD OF THE INVENTION

The present invention relates to Bragg reflector gratings, and especially relates to distributed Bragg reflector gratings. The invention has particular utility in the field of integrated optical devices, particularly laser devices, and especially tuneable laser devices.

BACKGROUND ART

Distributed Bragg reflector gratings (DBR gratings) are well known in the art, and are formed from patterned refractive index changes along an optical path. In the case of a semiconductor waveguide the grating is commonly formed by etching a lithographic pattern into the structure part way through an epitaxial growth process, and then growing on top of this a material of a different refractive index. The lithographic patterns may, for example, be formed holographically using an optical interference pattern, photolithographically by exposing through a mask, or by means of electron-beam (e-beam) lithography by forming the pattern with an electron beam.

An important feature of a DBR grating is its "pitch" (also known as the "period" of the grating), i.e. the minimum spacing between identical repeating points along the grating. The simplest DBR grating has a single constant pitch, and produces a reflection spectrum with a main peak at a wavelength determined by the pitch of the grating, plus some smaller side peaks. The relationship between the wavelength of the main wavelength peak and the pitch of the grating is: wavelength=$2n_{eff} \times$pitch, where $n_{eff}$ is the effective refractive index experienced by the light. The shape of the peak of a single pitch grating is a $\text{sinc}^2$ function. Also, increasing the length of the grating increases its reflective strength, although with a diminishing effect with increasing length.

Many other designs of DBR gratings are known, including chirped gratings (i.e. gratings having a pitch that varies continuously along the length of the grating), and gratings that produce a comb-like spectral response such as phase-change gratings and sampled gratings (the latter comprising sections of interrupted, i.e. spaced-apart, gratings). The known chirped gratings typically have a monotonically varying pitch (i.e. a pitch that only increases, or alternatively only decreases, continuously along the length of the grating), for example a linearly varying pitch. It is also known to make a sampled grating of chirped sections.

DBR gratings are used, for example, in tuneable lasers. FIG. 1 shows, schematically and in cross-section, a known DBR semiconductor laser as disclosed in WO 03/012936 (Bookham Technology plc). The laser is constructed in a series of layers, with a waveguide layer 1 formed between a lower layer 2 and an upper layer 3. (There may be other layers in the structure, but for clarity they are not shown.) The laser has four principal sections: a gain section 61; a phase change section 60; and front and rear reflecting sections 62 and 50, respectively. The rear reflecting section 50 comprises a phase shifted distributed Bragg reflector grating 51 formed in the upper layer 3. Such a reflector produces a comb of reflectance peaks at separated wavelengths, and each peak is of substantially the same height. The front reflector section 62 comprises a linearly chirped DBR grating having a progressive pitch variation along its length. Above the chirped grating are a series of individual adjacent electrodes 65 to 72, which define sub-region chirped gratings (or chirped grating sections) that together comprise the overall chirped grating; each of the chirped grating sections reflects over a range of wavelengths. The length of a chirped grating section of a DBR grating has an effect on the reflection spectrum that is due to that section. The longer the grating section is, for a constant range of pitches, the narrower is the spectral peak it produces. (It should be noted that it is generally difficult to distinguish the effect of one section from the others until they are tuned relative to one another.)

On the upper surface of the laser illustrated in FIG. 1 there is a series of electrodes 52 to 72. Electrode 52 can be used to inject current into the rear reflecting section 50, so as to shift the wavelengths of the entire comb of reflecting peaks produced by the rear reflecting section. Electrode 63 can be used to control the phase section 60, and electrode 64 can be used to inject current into the gain section 61 to make it create light. The electrodes 65 to 72 are able to inject current into different regions of the chirped grating 62. A further electrode 73 is provided on the lower surface of the laser, is common to all the sections, and may typically be connected to a common ground.

FIG. 2 is a modified version of FIG. 10 of WO 02/075867 (Bookham Technology plc), which shows the application of a tuning current to one section of a monotonically chirped DBR grating of a tuneable laser of the type shown in FIG. 1. In this figure, an upper portion shows, schematically, the front reflecting section 62 of the laser shown in FIG. 1. Below this is a graphical representation showing the variation in grating pitch (line 96) as a function of position (x) along the chirped grating 86 of the front reflecting section 62. (The figure has been modified to include dots on line 96, which represent the median grating pitch of each section of the grating.) This graph is aligned (as indicated by the dashed lines) with the upper diagram of the chirped grating 86 (including the electrodes 65 to 72) such that each value of grating pitch shown in the graph corresponds to the pitch of the grating directly above it. Below the graph of grating pitch versus position along the chirped grating is an aligned graphical representation showing schematically the reflectivity of the chirped grating as a function of wavelength. The variation in wavelength along the x-axis of the lower graph also corresponds to the position (x) along the chirped grating 86.

In order for the laser to lase, it is necessary to have both a population inversion of charge carriers within the gain material and to have at least one, and preferably only one, wavelength to be above the lasing threshold. This is achieved by injecting sufficient current into the gain section 61 through electrode 64 to create the population inversion and by tuning the reflection spectrum of the front reflecting section 62 such that it will preferentially reflect the light at a wavelength corresponding to one of the reflective peaks of the reflection spectrum of the rear grating 51 more strongly than that of other wavelengths, and therefore that wavelength will become the preferred (enhanced) wavelength, and the laser will thus commence to lase at that wavelength.

The selection of a particular wavelength for preferential reflection by the front reflecting section 62 is achieved by passing an electrical current through at least one of the electrodes 65 to 72. For example, as shown in FIG. 2, current may be passed through electrode 68 above the portion of the chirped grating which corresponds to the region 98 in the grating pitch line 96. The effect of the passage of current is to increase the current density in that region of the grating, which lowers the refractive index of the grating layer 86 directly below the electrode 68. The lowering of the refractive index has the effect of making the grating reflect at a lower wavelength, which is the same effect as would be obtained by shortening the grating pitches in that region. This means that the effective grating pitches of the region of the chirped grating below the electrode 68 are substantially the same as the grating pitches of the region of the grating below electrode 67, as indicated by the dotted portion 99 of the grating line 96. Consequently, there are now two regions of the chirped grating (the regions below electrodes 67 and 68) that reflect at the same range of wavelengths, and this is shown in the lowest graph of FIG. 2. It can be seen that there is a trough 102 in the reflectivity of the grating which corresponds to the region 98 that now reflects at a lower wavelength, but there is an enhancement of the reflectivity of the region 97. Light at the wavelength that corresponds to the position of peak 101 is thus selectively reflected, and the laser commences to lase at a wavelength within the peak 101 that corresponds with a reflective peak of the rear grating 51.

European Patent Application EP 0559192 discloses a distributed Bragg reflector grating comprising repeating identical chirped sections, i.e. chirped grating sections that all have the same range of grating pitches.

U.S. Pat. No. 6,141,370 also discloses (as prior art) chirped gratings similar to those disclosed in EP 0559192, comprising repeating identical chirped sections, i.e. chirped grating sections that all have the same range of grating pitches.

U.S. Pat. No. 5,838,714 discloses a three section DBR grating laser in which the grating comprises a repeating pattern of a plurality of sections, each section having a constant pitch, but different sections having different pitches. The laser has electrodes connected such that each grating section is electrically connected in parallel with other sections having the same pitch.

U.S. Pat. No. 5,379,318 discloses a tuneable laser comprising two sectioned DBR gratings, each of which has constant pitch sections such that each DBR grating has a step-like pitch profile and produces a comb-like reflection spectrum. The DBR gratings are situated on opposite sides of the gain section of the laser, and the pitches of the grating sections are such that the two comb-like spectra have interleaved peaks. In operation an individual peak due to one section of one DBR grating is tuned to overlap in wavelength with that of a peak from a section of the other DBR, so that the laser lases at that wavelength.

SUMMARY OF THE INVENTION

A first aspect of the present invention provides a Bragg reflector grating, comprising a plurality of chirped grating sections, wherein at least a first chirped grating section and a second chirped grating section have differing ranges of grating pitches, and wherein the combined range of grating pitches provided by the first and second chirped grating sections includes at least one discontinuity, such that: (a) the first and second chirped grating sections have at least one grating pitch in common; and/or (b) there is at least one range of grating pitches within the combined range of grating pitches that is absent.

It is particularly preferred for the (or each) discontinuity in the combined range of grating pitches to be such that the first and second chirped grating sections have at least one grating pitch in common.

Consequently, a second aspect of the invention provides a Bragg reflector grating, comprising a plurality of chirped grating sections, wherein at least a first chirped grating section and a second chirped grating section have differing ranges of grating pitches, and wherein the first and second chirped grating sections have at least one grating pitch in common.

In preferred embodiments of the invention, the chirped grating sections have a plurality of grating pitches in common (i.e. they preferably have a sub-range of grating pitches in common).

Providing the chirped grating sections with differing ranges of grating pitches while also providing them with one or more grating pitches in common, means that the grating pitch ranges of the chirped grating sections partially overlap each other. This partial overlapping of pitch ranges can enable some or all of the chirped grating sections each to have a larger pitch range than a corresponding chirped grating section of a monotonically varying chirped DBR grating such as that shown in FIGS. 1 and 2; in particular, it can provide an increased range of pitches for the same length of grating section, for example.

The skilled person is likely to regard such an increase in pitch ranges as being disadvantageous, because increasing the pitch range produces a wider reflection spectrum (i.e. a greater range of wavelengths at which the chirped grating section reflects). However, there are at least some circumstances in which it is in fact advantageous. For example, as indicated above in relation to the known arrangements shown in FIGS. 1 and 2, one DBR grating reflector of a tuneable laser may be designed to produce a "comb" of reflection peaks that are separated in wavelength, and an opposite DBR grating reflector of the laser may comprise chirped grating sections that are tuned to produce a reinforced reflection peak with which one of the reflection peaks of the comb coincides, in order to cause the laser to lase at that wavelength. For such arrangements, a broader reinforced peak (i.e. containing a broader range of wavelengths) can allow a greater tuning range for the reflection peak from the "comb", within the reinforced peak. Consequently, the provision of chirped grating sections with broader grating pitch ranges can provide improved wavelength tuning control. Such improved wavelength tuning control may make the laser less sensitive to any inaccuracies in the tracking during tuning of the reflective peaks of the front and rear gratings corresponding to the lasing peak (e.g. such as due to non-uniformities in tuning performance). It can also permit greater manufacturing tolerances, because a greater degree of variability in construction can be accommodated. An increase in permitted manufacturing tolerances can increase manufacturing yield, because fewer devices need to be rejected.

The skilled person will understand that, alternatively, the range of wavelengths provided in the reflection peak of each chirped grating section of a DBR grating could be increased by making each section shorter in length whilst maintaining the same pitch range, because this would broaden the $sinc^2$ part of the reflection spectrum. However, shortening the whole DBR grating (whilst maintaining the same grating pitch range) would produce a DBR grating with a weaker reflective strength. This would have the undesirable consequence of disturbing the balance of the reflection strengths between the front and back reflection gratings of a laser. In contrast, by means of the present invention it is possible to maintain the same average reflective strength of a chirped DBR grating reflector as a whole. Thus, the invention enables increased freedom in DBR grating design. Additionally, it allows a change in the optical properties of a DBR laser without changing the layout of the laser (i.e. its size and shape).

In preferred embodiments of the invention, the Bragg reflector grating comprises three or more chirped grating sections that have differing ranges of grating pitches. Preferably, the combined range of grating pitches provided by the three or more chirped grating sections includes at least two discontinuities, such that there are at least two instances of each of two chirped grating sections having one or more grating pitches in common (i.e. preferably there are at least two instances of partially overlapping grating pitches).

In some preferred embodiments of the invention, only a portion (i.e. not all) of the chirped grating sections of the DBR grating have one or more grating pitches in common with another grating section of the DBR grating. For example, for some applications it can be advantageous for one or more chirped grating sections having grating pitch ranges approximately in the middle of the entire range of grating pitches for the entire DBR grating, to have partially overlapping grating pitch ranges. This can be advantageous because the gain spectrum of the gain section of a tuneable laser is typically peaked with a maximum towards the middle of the tuning range, which can lead to a non-uniformity in the laser's sidemode suppression ratio (SMSR). By producing a DBR grating in which sections corresponding approximately with the middle of the pitch range include pitch range overlaps (while those at the ends of the range do not, or at least have smaller overlaps), the reinforced reflection peaks will generally be stronger (of greater power) at the ends of the wavelength range than in the middle. This can serve to improve the uniformity of the SMSR across the tuning range, and thus can increase performance and/or manufacturing yield. More generally, the degree of overlapping of the pitch ranges of the chirped grating sections, and the positioning of such overlapping within the wavelength tuning range, can be tailored to produce a desired effect on the reflection spectrum of the DBR grating, and thus, for example, on the emission spectrum of a tuneable laser incorporating the DBR grating.

Alternatively, in other embodiments of the invention, every chirped grating section of the DBR grating may have one or more grating pitches in common with another grating section of the DBR grating (i.e. partially overlapping grating pitches).

It will be understood that the chirped grating sections of the DBR grating may be physically arranged in any convenient arrangement. For example, it is not generally necessary for grating sections having adjacent (or partially overlapping) ranges of grating pitch to be physically situated next to each other in the DBR grating. However, for many embodiments of the invention such a physical arrangement will often be the most convenient.

It will also be understood that the chirp of each chirped grating section may be chosen independently of the profile of median grating pitches. The chirp of a chirped grating section may be linear or non-linear, and the direction of increasing chirp of the different chirped grating sections may all be the same, or some may be oppositely chirped with respect to others.

It was mentioned above that the (or each) discontinuity in the combined range of grating pitches provided by the first and second chirped grating sections may be such that there is at least one range of grating pitches within the combined range of grating pitches that is absent. More preferably, three or more chirped grating sections may have differing ranges of grating pitches, and the combined range of grating pitches provided by the three or more chirped grating sections may, for example, include at least two discontinuities, such that at least two ranges of grating pitches in the combined range of grating pitches are absent. Consequently, in such embodiments of the invention, there are gaps in the range of grating pitches provided by the entire DBR grating.

It will be understood, therefore, that the invention enables there to be a large degree of flexibility in the grating pitches that the DBR grating can provide. This flexibility is achieved by means of the discontinuities in the grating pitch range of the DBR. Such discontinuities preferably comprise partial overlaps in the grating pitch ranges of the chirped grating sections, but they may additionally or alternatively comprise absences in the grating pitch range of the DBR. The flexibility enables Bragg reflector gratings to be designed to meet any of a variety of different requirements. In particular, it enables the provision of a variety of tuneable lasers, meeting any of a variety of requirements.

Accordingly, a third aspect of the invention provides a tuneable laser comprising a gain section and at least one Bragg reflector grating according to the first and/or second aspect of the invention.

The tuneable laser preferably includes two reflectors, respectively situated on opposite sides of the gain section. One or both of the reflectors may comprise a Bragg reflector grating according to the invention. For versions in which only one of the reflectors is a Bragg reflector grating according to the invention, the other reflector may, for example, comprise another grating, or a mirror.

In at least some versions, the tuneable laser preferably also includes a phase change section.

The Bragg reflector grating, and the tuneable laser, according to the invention preferably are fabricated from semiconductor material. Preferred semiconductor materials include III/V materials, e.g. InP and/or GaAs based materials, but other semiconductors may be used in addition or instead.

BRIEF DESCRIPTION OF THE DRAWINGS

An embodiment of the present invention will now be described, by way of example, with reference to the accompanying figures, of which.

DETAILED DESCRIPTION OF THE EMBODIMENTS

Figure 1:
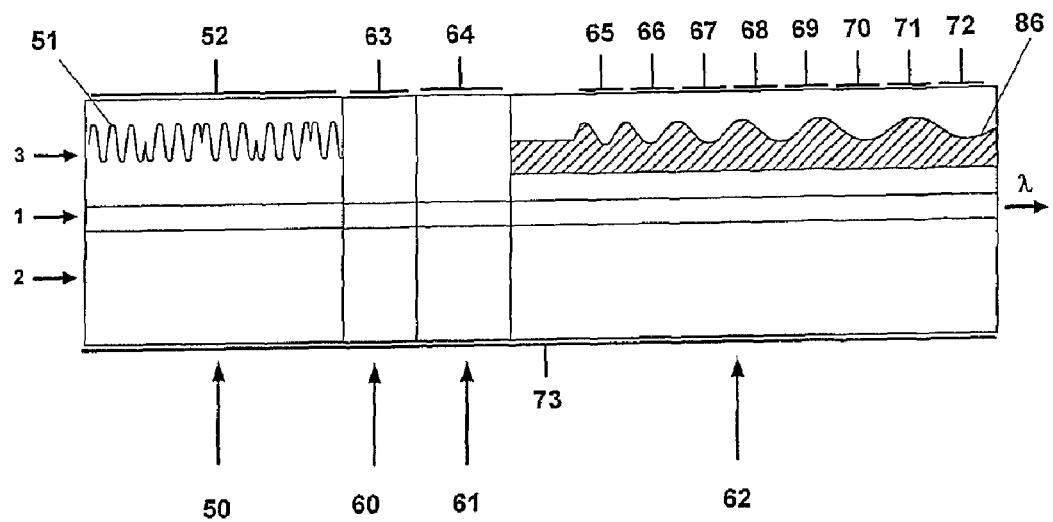
FIG. 1 shows, schematically and in cross-section, a known DBR semiconductor tuneable laser.
Figure 2:
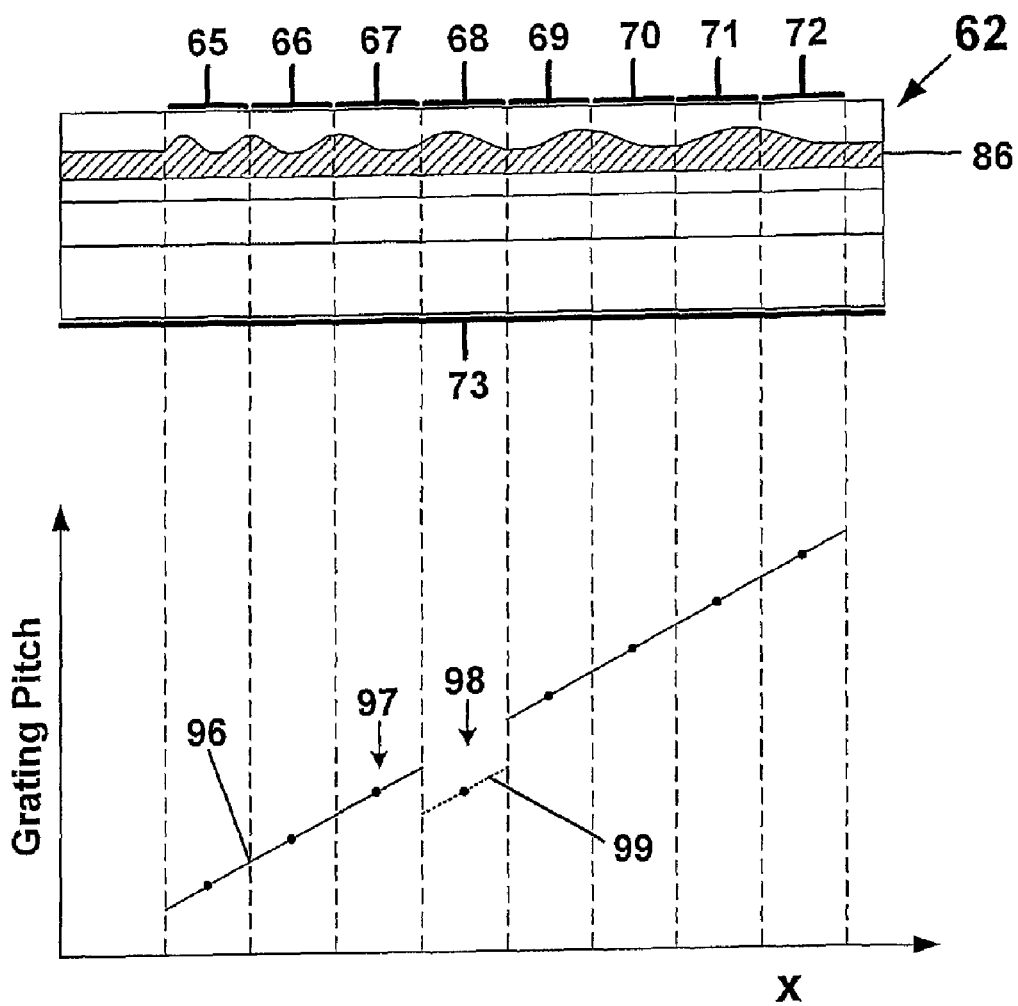
FIG. 2 shows, schematically, the effect of the application of a tuning current to one section of a monotonically chirped DBR grating of a tuneable laser of the type shown in FIG. 1.
Figure 2:
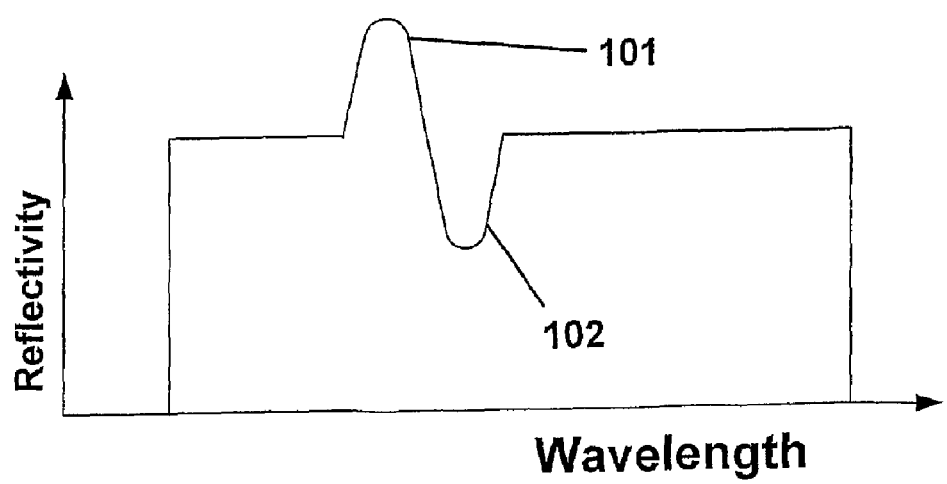

FIGS. 1 and 2 are described above.

Figure 3:
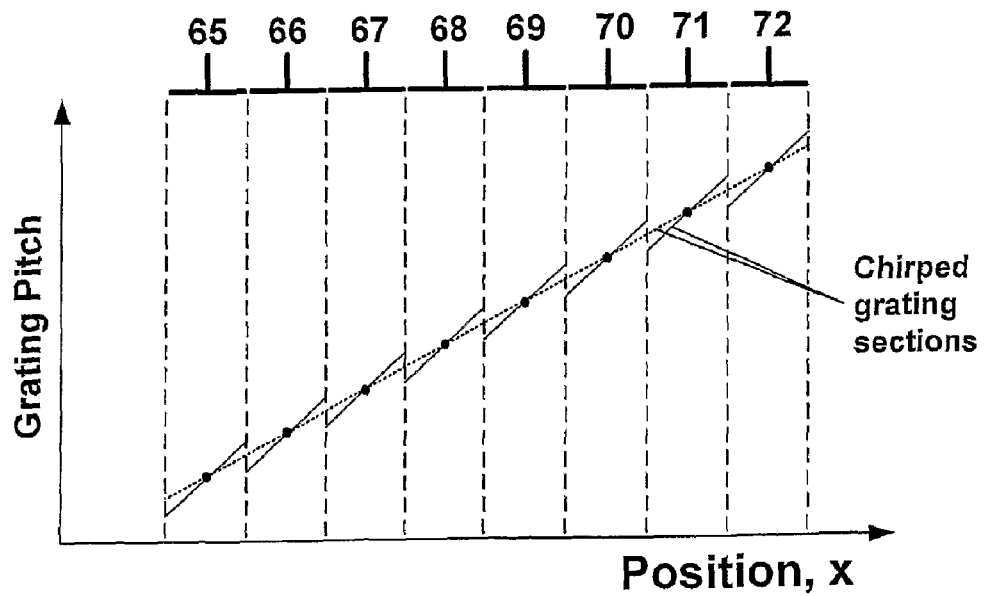
FIG. 3 shows, schematically, the variation in grating pitch of an embodiment of a DBR grating according to the invention.

FIG. 3 is a schematic diagram, similar to the type of diagram included in FIG. 2, showing the variation in grating pitch of an embodiment of a distributed Bragg reflector grating according to the invention. In particular, the diagram shows the variation in grating pitch as a function of position along the grating. The entire grating includes eight chirped grating sections, each of which has a respective electrical contact (electrode) associated with it, indicated by the reference numerals 65-72. The variation in grating pitch for a known monotonically chirped grating (also comprising eight chirped grating sections of corresponding length) is indicated, for comparison, by the dotted line. Each of the chirped grating sections of the grating according to the invention is shown to have a greater range of grating pitches than a corresponding chirped grating section of a conventional grating with the same profile of median grating pitches. Consequently, there are discontinuities in the range of grating pitches, such that adjacent chirped grating sections have a sub-range of grating pitches in common (i.e. they have partially overlapping grating pitches). This produces a "slatted" arrangement in the grating pitch profile, as illustrated in the figure. The chirped grating sections may be ordered such that their median grating pitches form a monotonic series and there are no spatial gaps (i.e. regions of the DBR without written grating) between physically adjacent chirped grating sections.

Figure 4:
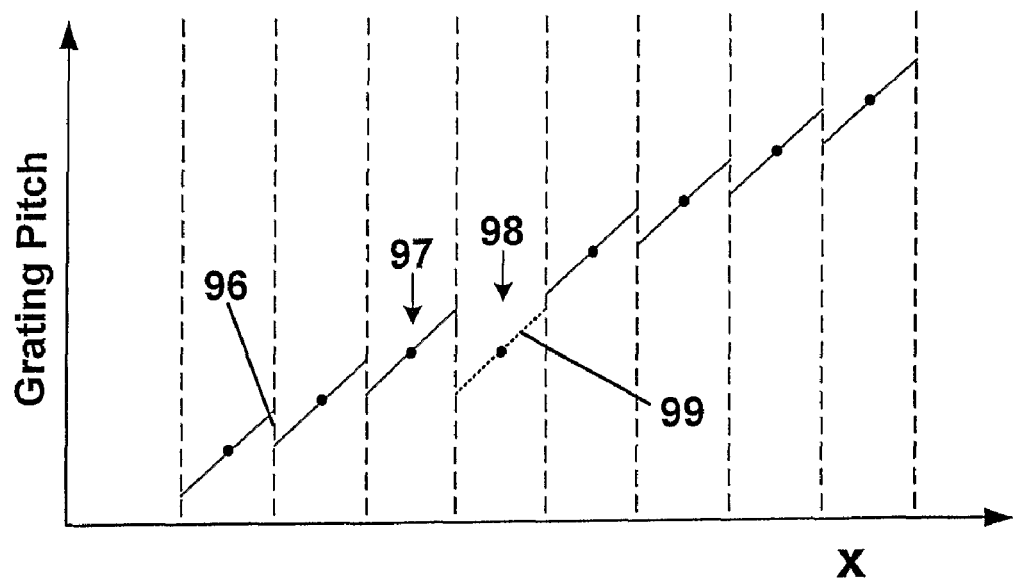
FIG. 4 shows, schematically, the effect of the application of a tuning current to one section of an embodiment of a DBR grating according to the invention.
Figure 4:
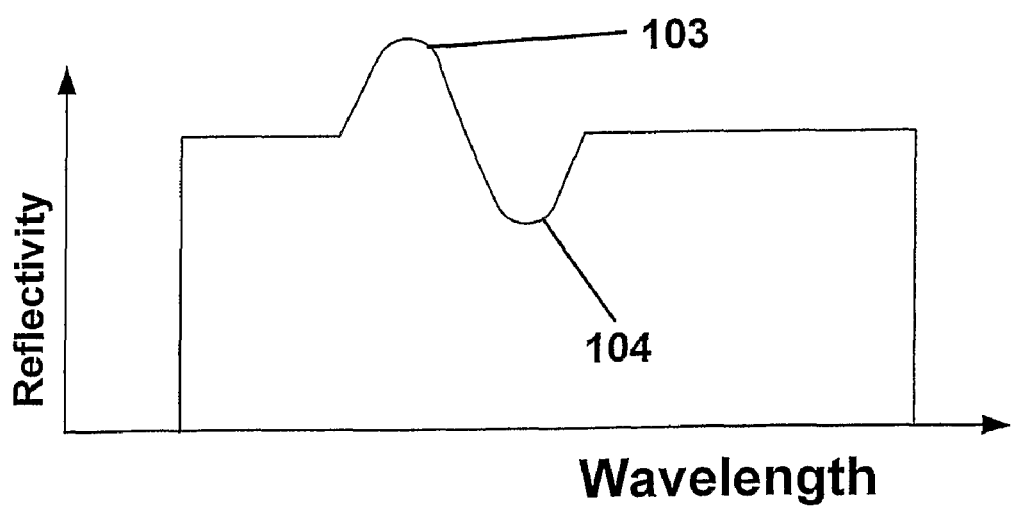

FIG. 4 shows, schematically, the effect of the application of a tuning current to one section of an embodiment of a DBR grating according to the invention. This embodiment is similar to that shown in FIG. 3, and enables a direct comparison with the known grating shown in FIG. 2. Additionally, the grating sections and the grating pitch line have been labelled in the same way as in FIG. 2. As can be seen, the effect of the application of a tuning current to the grating section labelled 98 is similar to the effect produced in the known grating shown in FIG. 2, except that the reinforced (enhanced) reflection peak 103 that is produced contains a broader range of wavelengths than does the corresponding reflection peak produced by the known grating. As explained above, this is due to the greater range of grating pitches provided by each grating section of this embodiment of the grating according to the invention, than provided by each grating section of the known grating. The consequent reflection trough 104 is also broader than that shown in FIG. 2, for the same reason.

As explained above, a broader reinforced peak (i.e. containing a broader range of wavelengths) can, for example, provide advantages for a tuneable laser containing such a Bragg reflector grating according to the invention. In particular, it can provide the advantage of allowing a greater tuning range within the reinforced peak, for a reflection peak produced by another grating at the opposite end of the laser. Consequently, the provision of chirped grating sections with broader grating pitch ranges can provide improved wavelength tuning control. It can also permit greater manufacturing tolerances, because a greater degree of variability in construction can be accommodated.

Figure 5:
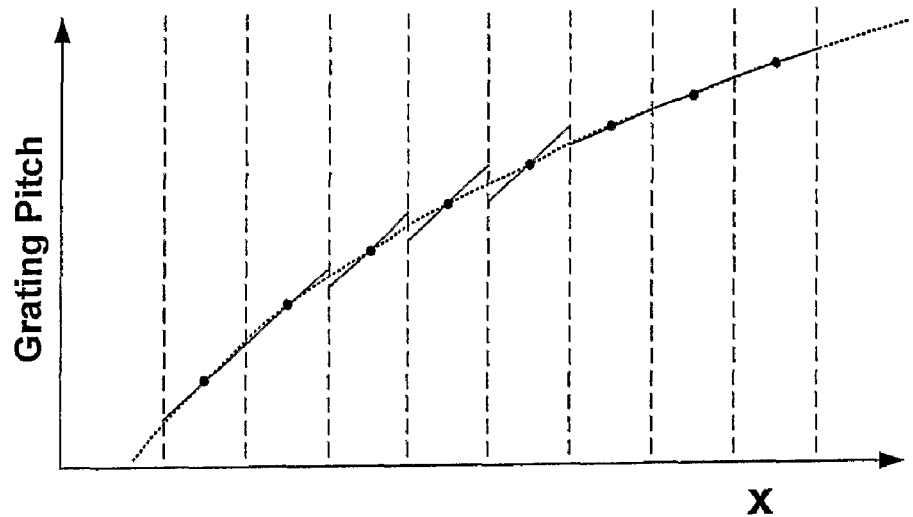
FIG. 5 shows, schematically, the variation in grating pitch with position along the Bragg grating reflector, of another embodiment of a reflector according to the invention.

FIG. 5 shows, schematically, the variation in grating pitch with position along the Bragg grating reflector, of another embodiment of a Bragg reflector grating according to the invention. In this embodiment, five chirped grating sections (out of a total of eight chirped grating sections) having grating pitch ranges approximately in the middle of the entire range of grating pitches for the entire DBR grating, have partially overlapping grating pitch ranges. As explained above, this can be advantageous because the gain spectrum of the gain section of a tuneable laser often has a maximum peak towards the middle of the tuning range, which can lead to a non-uniformity in the laser's side-mode suppression ratio (SMSR). By producing a DBR grating in which sections corresponding approximately with the middle of the pitch range include pitch range overlaps (while those at the ends of the range do not, or at least have smaller overlaps), the reinforced reflection peaks produced by tuning will generally be stronger (of greater power) at the ends of the wavelength range than in the middle. In this way the present invention can be used to profile the strength of the DBR grating, and/or peaks formed by reinforcement of the reflections of different chirped grating sections by tuning, as a function of position. This can serve to improve the uniformity of the SMSR across the tuning range, and thus can increase performance and/or manufacturing yield. It can additionally or alternatively be desirable to provide overlapping pitch ranges at one end of the DBR grating (and not at the other end).

Figure 6:
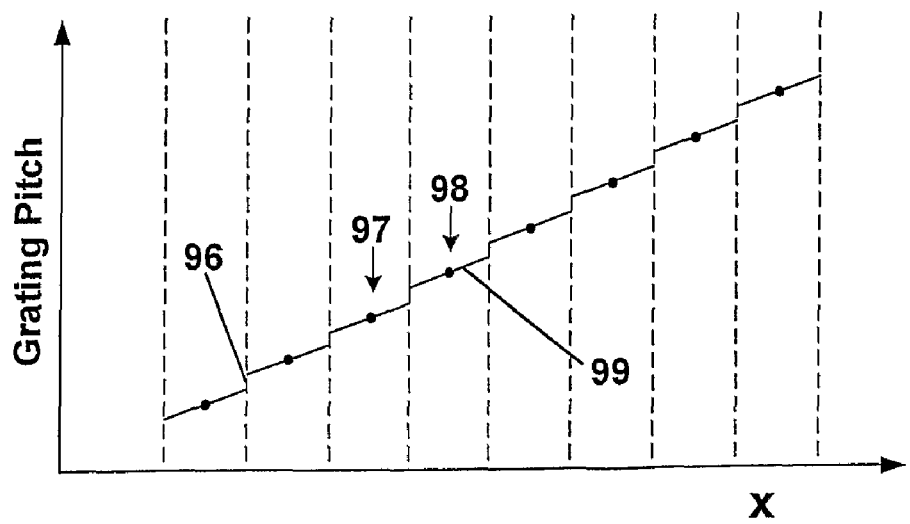
FIG. 6 shows, schematically, the variation in grating pitch with position along the Bragg grating reflector, of a further embodiment of a reflector according to the invention.

FIG. 6 shows, schematically, the variation in grating pitch with position along the Bragg grating reflector, of a further embodiment of a reflector according to the invention. In this embodiment, the discontinuities in the grating pitch variation between the chirped grating sections comprise gaps, or absences, in the grating pitch range, such that the grating pitch variation has a stepped profile. This illustrates the design flexibility enabled by the present invention, which allows Bragg reflector gratings to be designed to meet any of a variety of different requirements. In particular, it enables the provision of a variety of tuneable lasers, meeting any of a variety of requirements. With the present invention, due to the discontinuity (or discontinuities), it is possible to control the local pitch gradient and the median pitch of chirped grating sections independently of adjacent sections.

It will of course be understood that many variations may be made to the above-described embodiments without departing from the scope of the present invention.

The invention claimed is:

1. A Bragg reflector grating, comprising a plurality of chirped grating sections, wherein at least a first chirped grating section and a second chirped grating section have differing ranges of grating pitches, and wherein the combined range of grating pitches provided by the first and second chirped grating sections includes at least one discontinuity, such that: (a) the first and second chirped grating sections have at least one grating pitch in common; and/or (b) there is at least one range of grating pitches within the combined range of grating pitches that is absent.

2. A grating according to claim 1, wherein three or more chirped grating sections have differing ranges of grating pitches.

3. A grating according to claim 2, wherein the combined range of grating pitches provided by the three or more chirped grating sections includes at least two discontinuities: such that: (a) there are at least two instances of each of two chirped grating sections having at least one grating pitch in common; and/or (b) at least two ranges of grating pitches in the combined range of grating pitches are absent.

4. A grating according to claim 1, wherein said at least one discontinuity comprises each of two chirped grating sections having a plurality of grating pitches in common.

5. A grating according to claim 1, wherein only a portion of said plurality of chirped grating sections have one or more grating pitches in common with another of said plurality of chirped grating sections.

6. A grating according to claim 5, wherein one or more of said plurality of chirped grating sections having grating pitch ranges substantially in the middle of the entire range of grating pitches for the entire Bragg reflector grating have partially overlapping grating pitch ranges.

7. A grating according to claim 1, wherein each of said plurality of chirped grating sections has one or more grating pitches in common with another grating section of the plurality of chirped grating sections.

8. A grating according to claim 1, wherein said grating sections having adjacent, or partially overlapping, ranges of grating pitch are physically situated next to each other.

9. A tuneable laser, comprising a gain section and at least one Bragg reflector grating according to claim 1.

10. A tuneable laser according to claim 9, further comprising two reflectors, at least one of which is said Bragg reflector grating.

11. A tuneable laser according to claim 9, further comprising two Bragg reflector gratings.

12. A tuneable laser according to claim 10, wherein one of the reflectors comprises another grating or a mirror.

13. A tuneable laser according to claim 9, further comprising a phase change section.

14. A tuneable laser according to claim 9, fabricated in semiconductor material.

* * * * *